(12) United States Patent
Oka et al.

(10) Patent No.: US 10,425,069 B2
(45) Date of Patent: Sep. 24, 2019

(54) SIGNAL OUTPUT CIRCUIT

(71) Applicant: DENSO CORPORATION, Kariya, Aichi-pref. (JP)

(72) Inventors: Norimasa Oka, Kariya (JP); Hiroshi Kawago, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/065,199

(22) PCT Filed: Jan. 16, 2017

(86) PCT No.: PCT/JP2017/001215
§ 371 (c)(1),
(2) Date: Jun. 22, 2018

(87) PCT Pub. No.: WO2017/149956
PCT Pub. Date: Sep. 8, 2017

(65) Prior Publication Data
US 2019/0020332 A1 Jan. 17, 2019

(30) Foreign Application Priority Data
Mar. 1, 2016 (JP) .................................. 2016-038953

(51) Int. Cl.
*H03K 4/06* (2006.01)
*H03K 4/56* (2006.01)
(Continued)

(52) U.S. Cl.
CPC ................. *H03K 4/56* (2013.01); *H03K 5/04* (2013.01); *H03K 5/12* (2013.01); *H03K 5/1252* (2013.01);
(Continued)

(58) Field of Classification Search
CPC ............. H03K 4/56; H03K 19/018521; H03K 5/1252; H03K 5/04; H03K 19/0175; H03K 17/16; H03K 5/12; H04L 25/03
(Continued)

(56) References Cited

U.S. PATENT DOCUMENTS

| 8,487,663 | B2* | 7/2013 | Redoute | .................. H03K 5/12 327/108 |
| 8,873,648 | B2* | 10/2014 | Ishizeki | ......... H03K 19/018521 326/27 |
| 9,191,249 | B2* | 11/2015 | Ishizeki | ......... H03K 19/018521 |
| 2006/0145734 | A1* | 7/2006 | Abdel-Hamid | ............................. H03K 19/00384 327/112 |
| 2013/0315294 | A1* | 11/2013 | Ishizeki | ......... H03K 19/018521 375/232 |

(Continued)

FOREIGN PATENT DOCUMENTS

| JP | 04-222113 A | 8/1992 |
| JP | 2006-067334 A | 3/2006 |

(Continued)

*Primary Examiner* — Ryan Jager
(74) *Attorney, Agent, or Firm* — Posz Law Group, PLC

(57) ABSTRACT

A signal output circuit includes a slope control circuit, a capacitor, a noise detector circuit and a fail-safe circuit. The slope control circuit charges and discharges the capacitor, the first terminal of which is connected to an output terminal, according to the control signal level, and drives transistors using the voltage of the second terminal of the capacitor, thereby controlling the slope of the output single. The noise detector circuit detects noise superimposed on the output terminal. When noise is detected, the fail-safe circuit performs a forced drive operation on the transistor to output the output signal at a level corresponding to the level of the control signal is output, regardless of the transistor being driven by the slope control circuit.

10 Claims, 12 Drawing Sheets

(51) Int. Cl.
*H03K 5/12* (2006.01)
*H03K 17/16* (2006.01)
*H03K 19/0175* (2006.01)
*H04L 25/03* (2006.01)
*H03K 5/04* (2006.01)
*H03K 5/1252* (2006.01)
*H03K 19/0185* (2006.01)

(52) U.S. Cl.
CPC ......... *H03K 17/16* (2013.01); *H03K 19/0175* (2013.01); *H03K 19/018521* (2013.01); *H04L 25/03* (2013.01)

(58) Field of Classification Search
USPC ......................................................... 327/134
See application file for complete search history.

(56) References Cited

U.S. PATENT DOCUMENTS

| 2015/0043663 | A1* | 2/2015 | Ishizeki | H03K 19/018521 375/257 |
| 2017/0302261 | A1* | 10/2017 | Oka | H02M 1/08 |
| 2019/0020332 | A1* | 1/2019 | Oka | H03K 4/56 |

FOREIGN PATENT DOCUMENTS

| JP | 2006-245977 A | 9/2006 |
| JP | 2011-151576 A | 8/2011 |
| JP | 2012-114793 A | 6/2012 |

\* cited by examiner

| INPUT | | OUTPUT | |
|---|---|---|---|
| Sa | IN | HG | LG |
| L | L | H | L |
| L | H | H | L |
| H | L | L | L |
| H | H | H | H |

SIGNAL OUTPUT CIRCUIT

CROSS REFERENCE TO RELATED APPLICATIONS

This application is a U.S. national phase of International Application No. PCT/JP2017/001215 filed on Jan. 16, 2017, and is based on Japanese Patent Application No. 2016-038953 filed on Mar. 1, 2016, the disclosure of which is incorporated herein by reference.

TECHNICAL FIELD

The present disclosure relates to a signal output circuit that outputs a signal in accordance with the level of a control signal.

BACKGROUND ART

Signal output circuits such as communication drivers used for in-vehicle communication, for example, perform slope control for the purpose of reducing radiation noise. In the slope control, the inclination of the rising and falling edges (hereinafter referred to as slope) of the output signal is controlled. A common technique of controlling the slope is to charge and discharge a capacitor and to use the terminal voltage of the capacitor to achieve a desired slope waveform.

With the capacitor connected between the drain and the gate of an output transistor having its drain connected to the output terminal of the signal, the apparent capacitance (hereinafter simply referred to as "capacitance") when viewed from an input side is increased by the Miller effect. Accordingly, a desired slope waveform can be achieved using a capacitor that has a relatively small capacitance. With this configuration, however, if noise is superimposed on the output terminal, the noise may propagate to internal circuits through the capacitor and cause failures.

Patent Literature 1 discloses a technique of preventing such failures as mentioned above from occurring. In the configuration described in Patent Literature 1, an internal node that generates a slope-controlled signal is not connected to the output terminal that outputs the signal, and instead, the voltage of the internal node is made equal to the voltage of the output terminal by adding a current mirror circuit and the like. This configuration prevents failures when noise is superimposed on the output terminal, while achieving slope control of the output signal.

PRIOR ART LITERATURES

Patent Literature

Patent Literature 1: U.S. Pat. No. 8,487,663 B2

SUMMARY OF INVENTION

However, in the configuration of Patent Literature 1, the circuit that generates the slope-controlled signal and the current mirror circuit must be operated with a voltage equivalent to the high level voltage of the output signal (hereinafter referred to as "output-side voltage"). In applications where the output-side voltage is higher than the operating voltage of the internal circuits, the configuration described above must use devices having a high withstand voltage, which may lead to an increase in circuit surface area.

The minimum operating voltage of the configuration described above is higher by a threshold voltage Vt of the transistor that forms the current mirror circuit, since the voltage of the output terminal is determined using the current mirror circuit. If the configuration described above is applied to a communication driver for in-vehicle communication such as LIN (Local Interconnect Network), the voltage of an in-vehicle battery that may fluctuate largely is expected to be the output-side voltage, so that the increase in the minimum operating voltage would be a significant disadvantage.

An object of the present disclosure is to provide a signal output circuit capable of preventing failures caused by noise superimposed on the output terminal while preventing an increase in circuit scale and an increase in minimum operating voltage.

A signal output circuit according to a first aspect of the present disclosure is configured to output an output signal at a level in accordance with a level of a control signal, which is input from outside, from an output terminal connected to one main terminal of an output transistor by controlling drive of the output transistor based on the control signal. The signal output circuit includes a feedback capacitor, a slope control circuit, a noise detector circuit and a fail-safe circuit.

The feedback capacitor includes a first terminal and a second terminal, the first terminal being connected to the output terminal. The slope control circuit is configured to charge and discharge the feedback capacitor in accordance with the level of the control signal, and that is configured to control a slope of the output signal by driving the output transistor through a voltage of the second terminal of the feedback capacitor. The noise detector circuit is configured to detect noise superimposed on the output terminal. The fail-safe circuit is configured to perform a forced drive operation on the output transistor to output the output signal at the level in accordance with the level of the control signal, regardless of the output transistor being driven by the slope control circuit, in response to the noise being detected by the noise detector circuit.

According to this configuration, when noise is superimposed on the output terminal, the output transistor is forcibly driven by the fail-safe circuit irrespective of the drive of the output transistor by the slope control circuit. This prevents such a failure as an unexpected level of output signal even when the noise propagates to the slope control circuit via the feedback capacitor and affects the operation of the slope control circuit.

According to the configuration described above, when noise is superimposed on the output terminal, slope control is lost, but the output signal continues to be output in accordance with the level of the control signal, and failures can be reliably prevented. The noise detector circuit and fail-safe circuit can be configured with devices that operate by the power from a power supply similar to that for other internal circuits. The configuration described above therefore need not use devices having a high withstand voltage even when the output-side voltage is higher than the operating voltage of the internal circuits, so that an increase in circuit scale can be minimized. The configuration described above does not require a current mirror circuit for determining the voltage of the output terminal, so that it is free of the limitation that the minimum operating voltage may increase.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Several embodiments will be hereinafter described with reference to the drawings. The same numerals are given to substantially the same elements in various embodiments to omit repeated description.

(First Embodiment)

A first embodiment will be hereinafter described with reference to FIG. 1 to FIG. 7.

Figure 1:
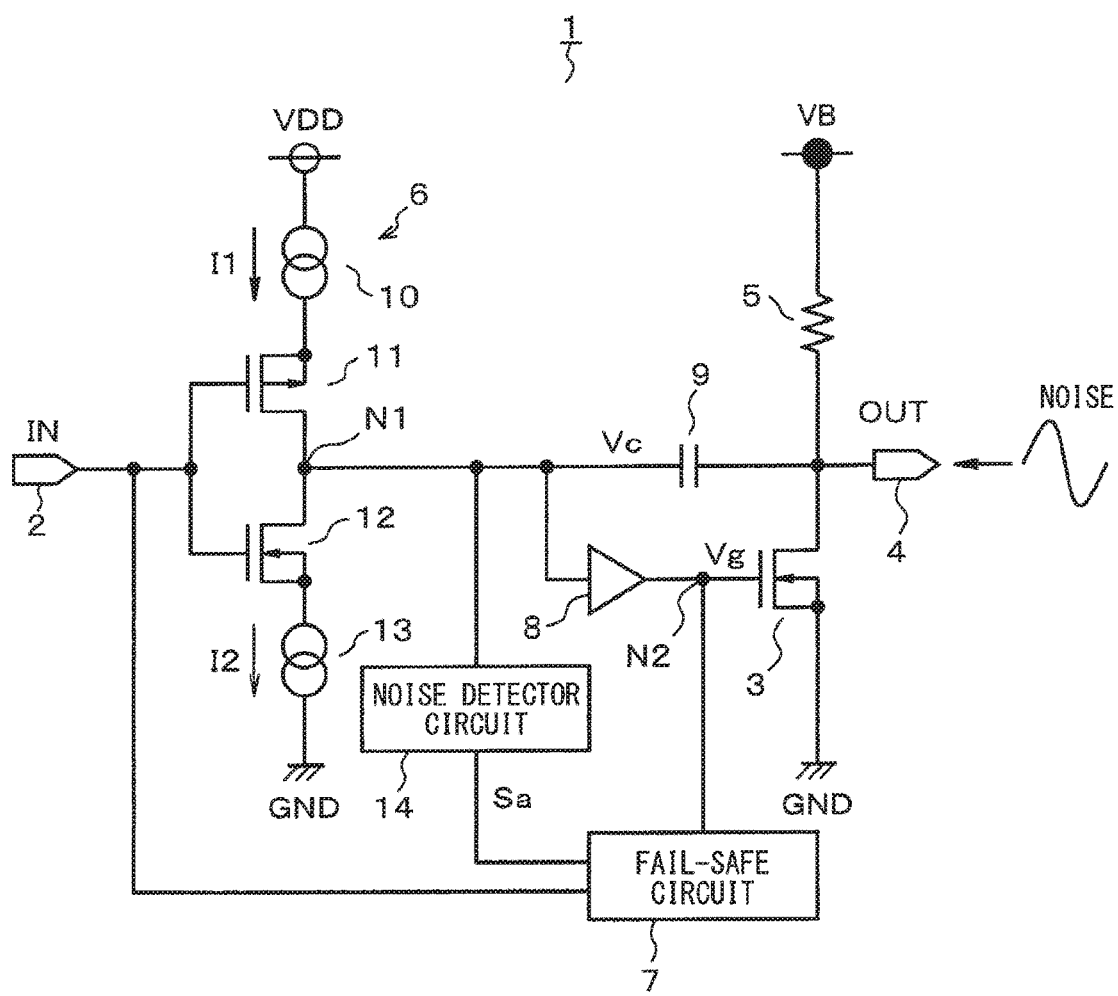
FIG. 1 is a diagram illustrating a schematic configuration of a signal output circuit according to a first embodiment.

As shown in FIG. 1, a signal output circuit 1 controls the drive of an N-channel MOS transistor 3 based on a control signal IN input from outside through an input terminal 2 to output a signal OUT from an output terminal 4 at a level in accordance with the level of the control signal IN. The control signal IN and output signal OUT are both a digital signal that indicates two values with two voltage levels, a high level (hereinafter referred to as H level) and a low level (hereinafter referred to as L level). Thus the "level" mentioned above is equivalent to a "voltage level".

The transistor 3 is equivalent to an "output transistor". The source of the transistor 3 is connected to ground GND that is the reference potential of the circuit, and the drain of the transistor 3 is connected to the output terminal 4, as well as to a power supply VB via a resistor 5. The power supply VB is provided by a battery (not shown), for example, its steady-state voltage being about +12V.

The drive of the transistor 3 is controlled by a slope control circuit 6 or a fail-safe circuit 7. Accordingly, the gate of the transistor 3 is connected, via a buffer 8, to a node N1, to which output of the slope control circuit 6 is given, as well as to a node N2, to which output of the fail-safe circuit 7 is given. The drain of the transistor 3 is equivalent to "one main terminal", while the gate is equivalent to a "current control terminal". A capacitor 9 is connected between the output terminal 4 and the node N1. The capacitor 9 is equivalent to a "feedback capacitor". Of two terminals of the capacitor 9, the one on the side of the output terminal 4 is equivalent to a "first terminal", and the one on the side of the node N1 is equivalent to a "second terminal".

The slope control circuit 6 is made up of a current source 10, a P-channel MOS transistor 11, an N-channel MOS transistor 12, and a current source 13, which are connected in series between a power supply VDD and ground GND. The power supply VDD provides the power for the operation of the signal output circuit 1, its steady-state voltage being about +5V. The drains of the transistors 11 and 12 are each connected to the node N1. The gates of the transistors 11 and 12 are each connected to the input terminal 2. The control signal IN is input to the input terminal 2 from a control circuit or the like (not shown) that controls the operation of the signal output circuit 1.

With the configuration described above, the slope control circuit 6 charges the capacitor 9 when the control signal IN is L level, and discharges the capacitor 9 when the control signal IN is H level. Voltage Vc of the second terminal of the thus charged and discharged capacitor 9 is given to the gate of the transistor 3 via the buffer 8. Therefore, the transistor 3 is driven in accordance with the voltage Vc that changes as the capacitor 9 is charged and discharged, as a result of which the slope of the output signal OUT is controlled. Current values I1 and I2 supplied from the current sources 10 and 13 are set suitably in accordance with a desired amount by which the slope is controlled, i.e., the desired slope of the output signal OUT.

Figure 2:
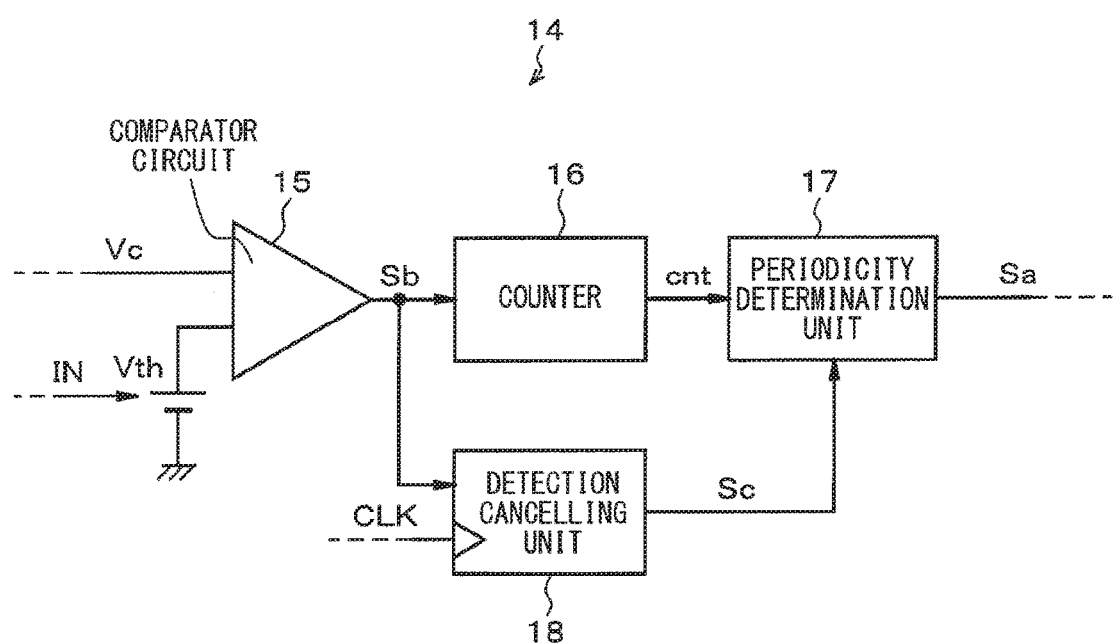
FIG. 2 is a diagram illustrating a specific configuration of a noise detector circuit.

A noise detector circuit 14 indirectly detects noise superimposed on the output terminal OUT based on voltage Vc, and determines whether the noise is periodic or not. A noise detection signal Sa output from the noise detector circuit 14 is given to the fail-safe circuit 7. The noise detection signal Sa becomes H level when periodic noise is detected. The noise detector circuit 14, more specifically, can be configured with a comparator circuit 15, a counter unit 16, a periodicity determination unit 17, and a detection cancelling unit 18, as shown in FIG. 2. The comparator circuit 15, counter unit 16, periodicity determination unit 17, and detection cancelling unit 18 all operate by power supplied from the power supply VDD.

The comparator circuit 15 configured with a comparator and others compares voltage Vc with voltage Vth, and outputs a pulse signal Sb that inverts when voltage Vc reaches voltage Vth. Voltage Vth can be switched in accordance with the level of the control signal IN. More specifically, during the H-level period of the control signal IN, i.e., during the OFF period of the transistor 3, voltage Vth is set to a value higher than the steady-state voltage of Vc during this period and lower than the value of voltage Vc when the transistor 3 starts to be turned on. During the L-level period of the control signal IN, i.e., during the ON period of the transistor 3, voltage Vth is set to a value lower than the steady-state voltage of Vc during this period and higher than the value of voltage Vc when the transistor 3 starts to be turned off.

The counter unit 16 configured with a counter and others counts the number of rising or falling edges of the pulse signal Sb, i.e., the number of pulses of the pulse signal Sb. When periodic noise is superimposed, the cycles of the pulse signal Sb counted by the counter unit 16 generally coincide with the cycles of the noise. Therefore, the number of counts by the counter unit 16 is equivalent to the "number of cycles of noise". The periodicity determination unit 17 configured with a logic circuit and others changes the noise detection signal Sa to H level when the number of counts (=count value cnt) by the counter unit 16 reaches or exceeds a predetermined number, e.g., equal to or more than four.

The detection cancelling unit 18 configured with a logic circuit and others starts measuring a predetermined end determination period Ta from the time point when the pulse signal Sb is inverted upon voltage Vc reaching voltage Vth. The measuring of the end determination period Ta is performed based on a clock signal CLK. The detection cancelling unit 18 outputs a cancelling signal Sc if no inversion occurred in the pulse signal Sb throughout the end determination period Ta. If there has been an inversion in the pulse signal Sb during the end determination period Ta, the detection cancelling unit 18 resets the measurement value to zero at that time point, and starts measuring a new end determination period Ta. The periodicity determination unit 17 changes the noise detection signal Sa to L level when the cancelling signal Sc is input.

The fail-safe circuit 7 performs a forced drive operation when the noise detection signal Sa given by the noise detector circuit 14 is H level. The forced drive operation refers to an operation for driving the transistor 3 such that an output signal OUT is output at the level in accordance with the level of the control signal IN irrespective of the drive of the transistor 3 by the slope control circuit 6. Thus the fail-safe circuit 7 performs the forced drive operation when periodic noise is detected by the noise detector circuit 14.

The fail-safe circuit 7 stops the forced drive operation when the noise detection signal Sa is L level. In other words, the fail-safe circuit 7 does not perform the forced drive operation during the period in which no noise is being detected by the noise detector circuit 14 and during the period in which non-periodic noise is being detected. After the start of the forced drive operation, the fail-safe circuit 7 ends the forced drive operation when the state in which no noise is detected by the noise detector circuit 14 continues for a duration of the end determination period Ta.

Figures 3, 4:
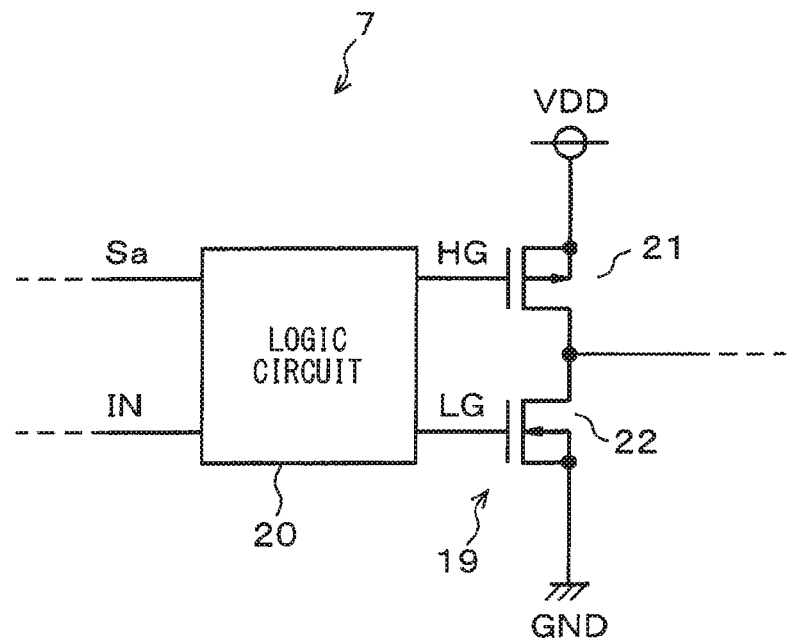
FIG. 3 is a diagram illustrating a specific configuration of a fail-safe circuit.
FIG. 4 is a diagram showing a truth table of a logic circuit that forms the fail-safe circuit.

More specifically, such fail-safe circuit 7 can be configured with a CMOS circuit 19 and a logic circuit 20, as shown in FIG. 3. A P-channel MOS transistor 21 and an N-channel MOS transistor 22 that form the CMOS circuit 19 are connected in series between the power supply VDD and ground GND. The drains of the transistors 21 and 22 are each connected to the gate of the transistor 3. Drive signals HG and LG output from the logic circuit 20 are given to the gates of the transistors 21 and 22, respectively.

The noise detection signal Sa and control signal IN are input to the logic circuit 20. The logic circuit 20 generates and outputs the drive signals HG and LG based on the input signals Sa and IN. More specifically, as shown in FIG. 4, when the noise detection signal Sa is L level, the logic circuit 20 outputs the drive signals HG and LG to turn off both of the transistors 21 and 22, irrespective of the level of the control signal IN. In other words, the forced drive operation is not performed when the noise detection signal Sa is L level.

When the noise detection signal Sa is H level, the logic circuit 20 turns on any one of the transistors 21 and 22 in accordance with the level of the control signal IN to forcibly turn on or off the transistor 3. In other words, the forced drive operation is performed when the noise detection signal Sa is H level.

Next, the effects of the configuration described above will be described.

[1] Operation When Noise is not Superimposed

When noise is not superimposed on the output terminal 4, the noise detection signal Sa is L level, so that the fail-safe circuit 7 does not perform the forced drive operation. Therefore, the slope control circuit 6 controls the drive of the transistor 3. The signal output circuit 1 thus outputs a slope-controlled output signal OUT of the level in accordance with the level of the control signal IN.

[2] Operation When Non-periodic Noise is Superimposed

When non-periodic noise is superimposed on the output terminal 4, the noise detection signal Sa remains at L level, so that the fail-safe circuit 7 does not perform the forced drive operation. Thus, similarly to when no noise is superimposed, the signal output circuit outputs a slope-controlled output signal OUT of the level in accordance with the level of the control signal IN.

[3] Operation When Periodic Noise is Superimposed

Figure 5:
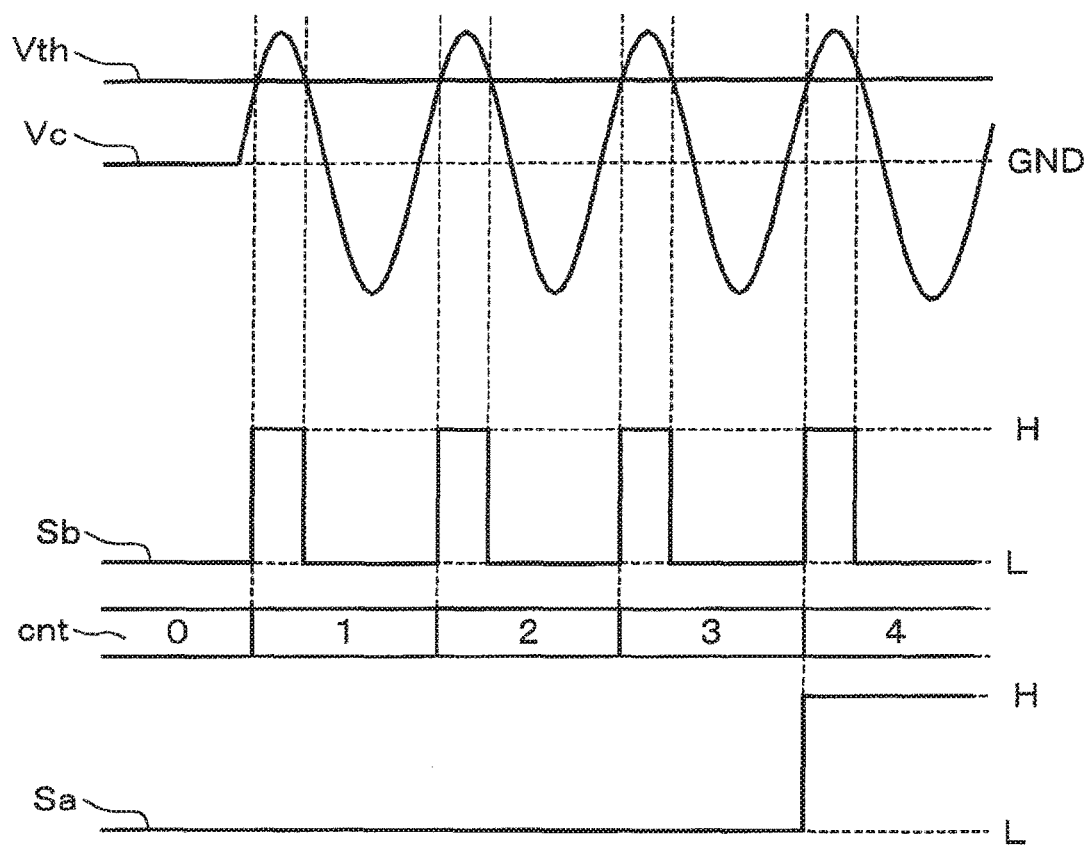
FIG. 5 is a chart showing waveforms of various parts for describing a noise detecting operation.

Here, it is assumed that periodic noise is superimposed on the output terminal 4 during a period in which the control signal IN is H level, i.e., in which the transistor 3 is turned off and an H-level output signal OUT is output. As shown in FIG. 5, when periodic noise is superimposed on the output terminal 4, the noise-affected voltage Vc repeats rising and falling such as to pass over voltage Vth. Thus the comparator circuit 15 outputs a pulse signal Sb having a number of pulses in accordance with the number of cycles of the noise.

When the number of counts by the counter unit 16 reaches four, the noise detection signal Sa turns to H level. In response, the fail-safe circuit 7 performs the forced drive operation. In this case, the gate voltage Vg of the transistor 3 is fixed to L level (=GND), so that the transistor 3 is turned off. The signal output circuit 1 thus outputs an output signal OUT of the level in accordance with the level of the control signal IN. The output signal OUT at this time is not slope-controlled.

[4] Operation When the Forced Drive Operation is Cancelled

Figure 6:
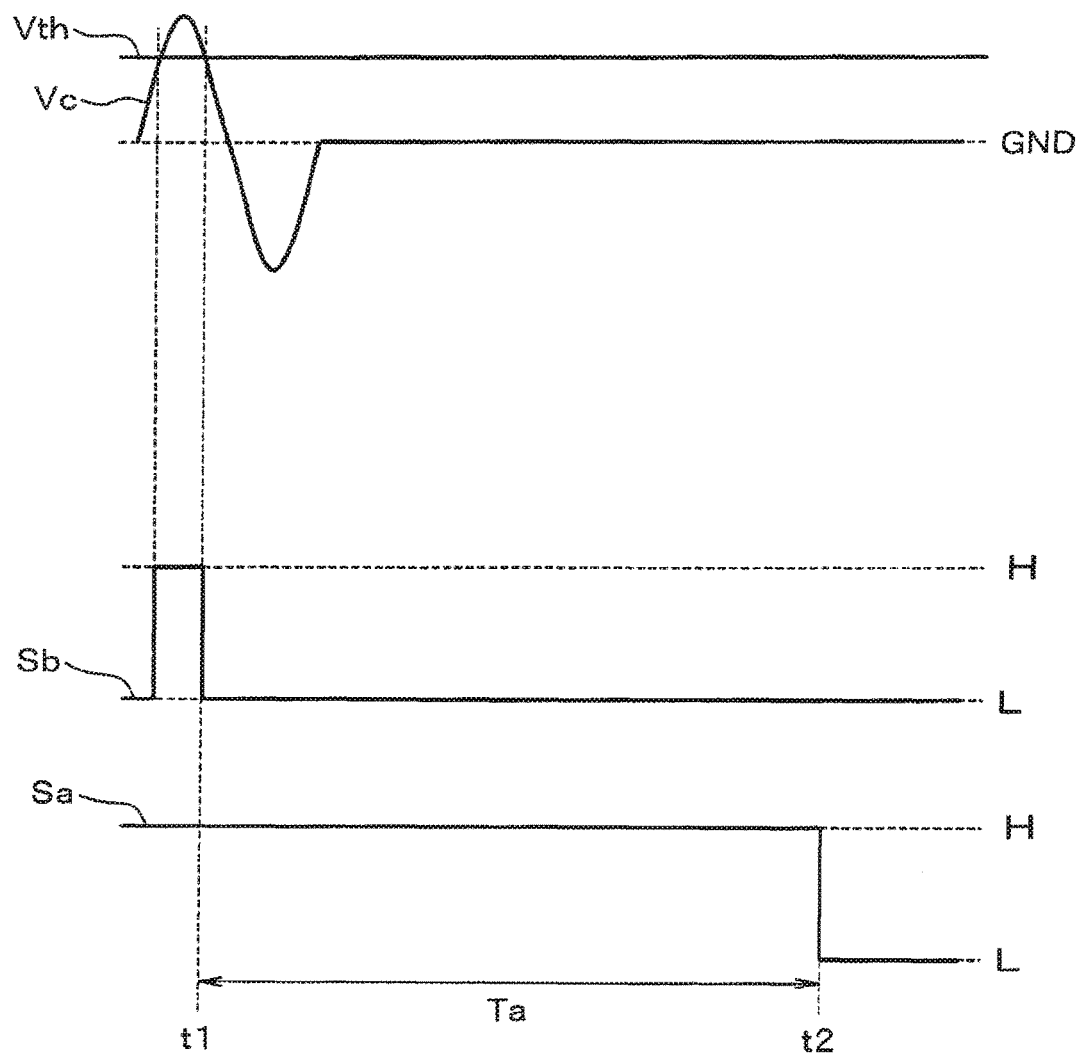
FIG. 6 is a chart showing waveforms of various parts for describing how the forced drive operation is stopped.

Here, it is assumed that the noise disappears after the start of the forced drive operation described above. As shown in FIG. 6, when noise disappears, pulses of the pulse signal Sb disappear. The detection cancelling unit 18 starts measuring the end determination period Ta from the time point t1 of the falling edge of the last pulse of the pulse signal Sb.

When the state where no noise is superimposed, i.e., where the pulse signal Sb has no pulses, continues until the end of measurement of the end determination period Ta, the detection cancelling unit 18 outputs a cancelling signal Sc at the time point t2 when the measurement has ended. In response, the periodicity determination unit 17 changes the noise detection signal Sa to L level, as a result of which the fail-safe circuit 7 ends the forced drive operation. The signal output circuit 1 thus outputs a slope-controlled output signal OUT of the level in accordance with the level of the control signal IN.

According to the signal output circuit 1 of this embodiment described above, the following effects are achieved.

When noise is superimposed on the output terminal 4, the fail-safe circuit 7 performs the forced drive operation. This prevents such a failure as an unexpected level of output signal OUT even when the superimposed noise propagates to the slope control circuit 6 via the capacitor 9 and affects the operation of the slope control circuit 6. That is, even if noise is superimposed on the output terminal 4, the signal output circuit 1 only loses its slope control feature, but can continue its main operation of outputting a signal OUT at the level in accordance with the level of the control signal IN.

Note that, the execution of the forced drive operation does not necessarily delete the slope of the output signal OUT. If the forced drive operation is performed during a period in which the level of the output signal OUT does not fluctuate, i.e., in which the output signal OUT is stable at H level or L level, as in period Tb in FIG. 7, the signal output circuit 1 can output the signal OUT of a waveform having a slope similar to that of the steady state.

Figure 7:
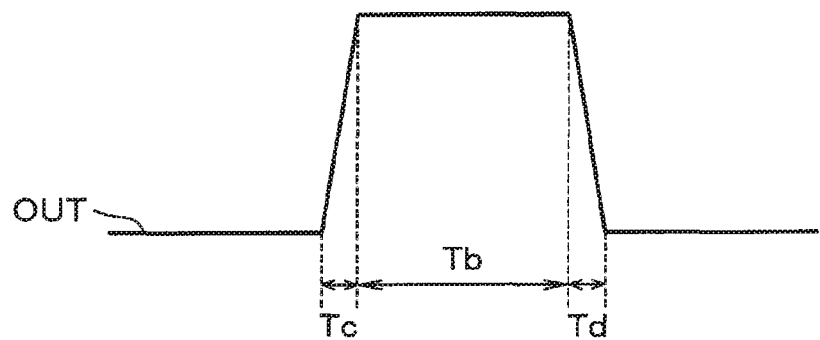
FIG. 7 is a waveform chart of an output signal.

On the other hand, when the forced drive operation is performed during a period in which the level of the output signal OUT fluctuates, i.e., a period of a rising or falling edge of the output signal OUT, as in periods Tc and Td in FIG. 7, the slope of the output signal OUT will be lost, and the waveform will have a steep rising or falling edge. However, it is considered that the signal output circuit 1 is under noise environment when the forced drive operation is being performed. Under such an environment, the necessity of minimizing noise radiating from the circuit is low, so that the loss of slope control by the signal output circuit 1 and increase of radiated noise will not pose any significant problem, The noise detector circuit 14 and fail-safe circuit 7 are configured with devices that operate by the power from the power supply VDD similar to that for other circuit devices that configure the signal output circuit 1. Therefore, the signal output circuit 1 need not use devices having a high withstand voltage even though the output-side voltage is higher than the operating voltage of the circuit as in this embodiment, so that an increase in circuit scale can be minimized. The signal output circuit 1 does not require a current mirror circuit for determining the voltage of the output terminal 4, so that it is free of the limitation that the minimum operating voltage may increase.

The fail-safe circuit 7 performs the forced drive operation when periodic noise is detected by the noise detector circuit 14. This prevents such a failure as execution of the forced drive operation based on an erroneous detection of noise. For example, the forced drive operation is not performed immediately when voltage Vc reaches voltage Vth by overshoot or undershoot resulting from normal operation such as slope control.

This also provides the following effects. When one-time noise such as ESD (Electro Static Discharge) is superimposed on the output terminal 4, the fail-safe circuit 7 does not perform the forced drive operation since the noise is non-periodic. Therefore, the protective operation by the self turn-on of the transistor 3 is not inhibited, and the self turn-on readily shunts a surge current to GND. Thus internal circuit devices including the transistor 3 and capacitor 9 can be protected from damage. In other words, the resistance against damage caused by ESD and the like of internal circuit devices can be maintained favorably.

The noise detector circuit 14 is configured to detect periodic noise using the counter unit 16 that counts the number of pulses of the pulse signal Sb, and the periodicity determination unit 17 that changes the noise detection signal Sa to H level when the number of counts reaches or exceeds a predetermined number. Such a configuration can be built with a counter and a small-scale logic circuit. Thus an increase in circuit scale of the noise detector circuit 14 and of the signal processing circuit 1 can be minimized.

After the fail-safe circuit 7 has started the forced drive operation, the fail-safe circuit 7 ends the forced drive operation when the noise detector circuit stops detecting noise. The slope control is recovered as soon as noise disappears, so that noise radiation from the signal output circuit 1 can be minimized. The signal output circuit 1 is configured to end the forced drive operation when the state in which no noise is detected continues for a duration of the end determination period Ta. This configuration can prevent the fail-safe circuit 7 from performing and ending the forced drive operation repeatedly in a situation where noise is intermittently superimposed with relatively short intervals.

The signal output circuit 1 can be applied to a communication driver for in-vehicle communication, such as a LIN communication driver. In this case, noise that could occur would have a sinusoidal waveform of about 1 MHz to 1 GHz with a cycle shorter than 1 μs. As mentioned above, the cycles of the pulse signal Sb counted by the counter unit 16 generally coincide with the cycles of the noise. When such noise is superimposed on the output terminal 4, the time required for the noise detector circuit 14 to detect this noise would be about 4 μs at longest.

The communication rate via LIN is about 10 kHz, and the pulse width of the pulse signal used in this communication is about 50 μs. If the signal output circuit 1 is applied to a communication driver of LIN, the time required for the noise detector circuit 14 to determine that the noise superimposed on the output terminal 4 is periodic will be extremely short as compared with a period of the communication.

Failures such as erroneous determination of the level of the output signal OUT, known as bit errors, in a microcomputer that receives and processes the output signal OUT, which will be the communication signal, can be prevented, even if the signal output circuit 1 performs the forced drive operation after detecting periodic noise.

The end determination period Ta measured by the detection cancelling unit 18 may also be set shorter than the communication cycle (e.g., 8 μs). In this way, the slope control is recovered quickly after noise disappears, so that noise radiation from the signal output circuit 1 can be minimized appropriately.

The signal output circuit 1 is configured to include the buffer 8 between the node N1 and the gate of the transistor 3. When noise is superimposed on the output terminal 4, the main path the noise will propagate through to internal circuits is the capacitor 9. There is a parasitic capacitance (not shown) between the drain and the gate of the transistor 3. Since the transistor 3 is provided in the output stage, the transistor 3 has a large size in order to secure a certain drive performance, so that the parasitic capacitance is also relatively large. The noise superimposed on the output terminal 4 could propagate to internal circuits such as the slope control circuit 6 via the parasitic capacitance. By providing the buffer 8 as noted above, the propagation path of the noise via the parasitic capacitance is shut, and therefore a failure such as an unexpected level of the output signal OUT due to malfunctioning of the noise-affected transistor 3 can be prevented from occurring. The buffer 8 also provides the effect of lowering the impedance of the gate node of the transistor 3, which reduces the amplitude of the noise.

(Second Embodiment)

A second embodiment, in which specific features of the noise detector circuit are changed from those of the first embodiment, will be described below with reference to FIG. 8 to FIG. 10.

Figure 8:
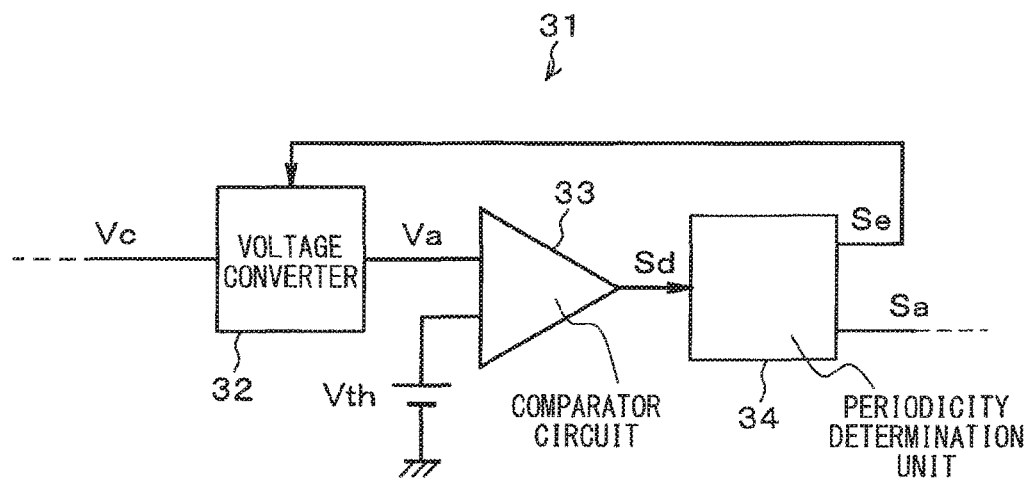
FIG. 8 is a diagram illustrating a specific configuration of a noise detector circuit according to a second embodiment.

A noise detector circuit 31 includes a voltage converter 32, a comparator circuit 33, and a periodicity determination unit 34 as shown in FIG. 8. The voltage converter 32 generates voltage Va that increases gradually every time there is a change in voltage Vc due to noise superimposed on the output terminal 4. In other words, voltage Va is equivalent to an integral of the number of cycles of the noise.

Figure 9:
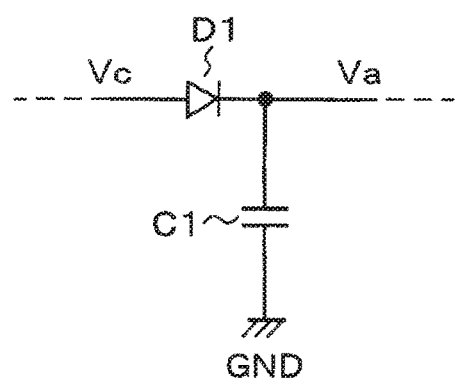
FIG. 9 is a diagram illustrating a specific configuration example of a voltage converter.
Figure 10:
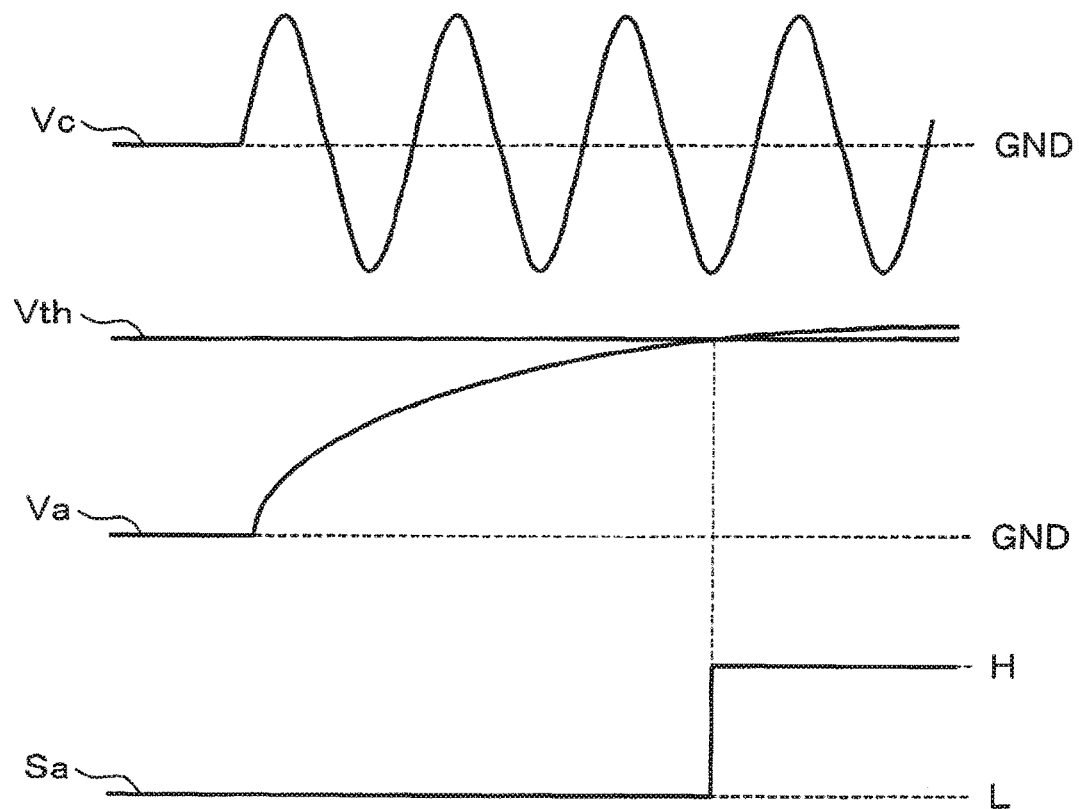
FIG. 10 is a chart showing waveforms of various parts for describing a noise detecting operation.

For the voltage converter 32, a configuration that uses the diode D1 and capacitor C1 shown in FIG. 9 may be adopted.

The comparator circuit 33 configured with a comparator and others compares voltage Va with voltage Vth, and outputs a pulse signal Sd that becomes H level when voltage Va reaches voltage Vth. In this case, voltage Vth is equivalent to a "determination reference voltage". Voltage Vth can be switched in accordance with the level of the control signal IN. More specifically, Vth is set to a predetermined voltage level that is higher than GND and lower than VDD during the period in which the control signal IN is H level. Vth is set to a predetermined voltage level that is higher than VDD during the period in which the control signal IN is L level. The periodicity determination unit 34 changes the noise detection signal Sa to H level when the pulse signal Sd changes to H level, and outputs a reset signal Se. When the reset signal Se is given, the voltage converter 32 resets the voltage Va to zero.

The periodicity determination unit 34 starts measuring a reset period Te from the time point of outputting the reset signal Se. The reset period Te is set longer than the time required for the voltage Va to rise from zero to voltage Vth when periodic noise expected to occur is superimposed on the output terminal 4. When the pulse signal Sd turns to H level again before the end of measurement of the reset period Te, the periodicity determination unit 34 outputs the reset signal Se and starts measuring the reset period Te again, while maintaining the noise detection signal Sa at H level. When the pulse signal Sd does not turn to H level again before the end of measurement of the reset period Te, the periodicity determination unit 34 changes the noise detection signal Sa to L level.

Next, the effects of the configuration described above will be described.

[1] Operation When Noise is not Superimposed

When noise is not superimposed on the output terminal 4, voltage Va has not reached voltage Vth yet and the noise detection signal Sa is L level, so that the fail-safe circuit 7 does not perform the forced drive operation. Therefore, the overall operation of the signal output circuit 1 in this case will be similar to that of the first embodiment.

[2] Operation When Non-periodic Noise is Superimposed

Even when non-periodic noise is superimposed on the output terminal 4, voltage Va does not reach voltage Vth and the noise detection signal Sa remains at L level, so that the fail-safe circuit 7 does not perform the forced drive operation. It is possible that voltage Va eventually reaches voltage Vth if non-periodic noise is superimposed several times, whereupon the noise detection signal Sa will turn to H level. In this case, however, it is not likely that voltage Va reaches voltage Vth again by the end of measurement of the reset period Te, and the noise detection signal Sa turns to L level, so that the forced drive operation by the fail-safe circuit 7 is not performed continuously. Therefore, the overall operation of the signal output circuit 1 in this case will be similar to that of the first embodiment.

[3] Operation When Periodic Noise is Superimposed

Here, it is assumed that periodic noise is superimposed on the output terminal 4 during the period in which the control signal IN is H level. As shown in FIG. 10, when periodic noise is superimposed on the output terminal 4, voltage Va rises gradually, and eventually reaches voltage Vth. Thereupon, the noise detection signal Sa turns to H level, and the fail-safe circuit 7 performs the forced drive operation. The waveform of voltage Va is shown schematically in FIG. 10. When the voltage converter 32 has a configuration made up of a diode and a capacitor as shown in FIG. 9, the actual voltage Va will have a waveform with relatively steep rising edges in the periods when noise is higher than GND and relatively gradual falling edges in the periods when noise is lower than GND repeated alternately.

In this case, voltage Va rises again to voltage Vth by the end of measurement of the reset period Te measured by the periodicity determination unit 34, so that the noise detection signal Sa is maintained at H level and the forced drive operation is performed continuously. Therefore, the overall operation of the signal output circuit 1 in this case will be similar to that of the first embodiment.

[4] Operation When the Forced Drive Operation is Cancelled

Here, it is assumed that the noise disappears after the start of the forced drive operation described above. When noise disappears, voltage Va stops rising. Therefore, voltage Va does not reach voltage Vth again by the end of measurement of the reset period Te measured by the periodicity determination unit 34, so that the noise detection signal Sa turns to L level and the forced drive operation by the fail-safe circuit 7 ends. The overall operation of the signal output circuit 1 in this case is thus similar to that of the first embodiment.

The present embodiment described above provides the effects similar to those of the first embodiment.

The noise detector circuit 31 detects noise based on whether or not voltage Va, which is equivalent to an integral of the number of cycles of the noise, reaches voltage Vth. According to this embodiment, noise having much higher frequencies than the frequencies of comparators and the like that form the comparator circuit 33 can be detected irrespective of the frequency characteristics of these devices.

(Third Embodiment)

A third embodiment, in which specific features of the noise detector circuit are changed from those of the first embodiment, will be described below with reference to FIG. 11 and FIG. 12.

Figure 11:
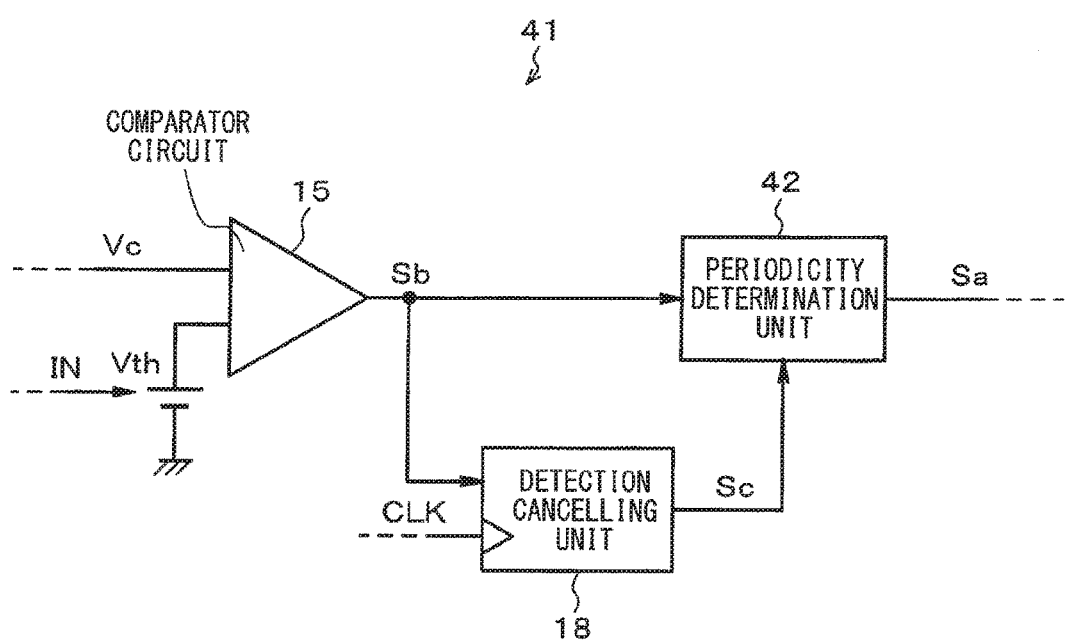
FIG. 11 is a diagram illustrating a specific configuration of a noise detector circuit according to a third embodiment.

As shown in FIG. 11, the noise detector circuit 41 is different from the noise detector circuit 14 of the first embodiment in that the noise detector circuit 41 includes a periodicity determination unit 42 instead of the counter unit 16 and periodicity determination unit 17.

Figure 12:
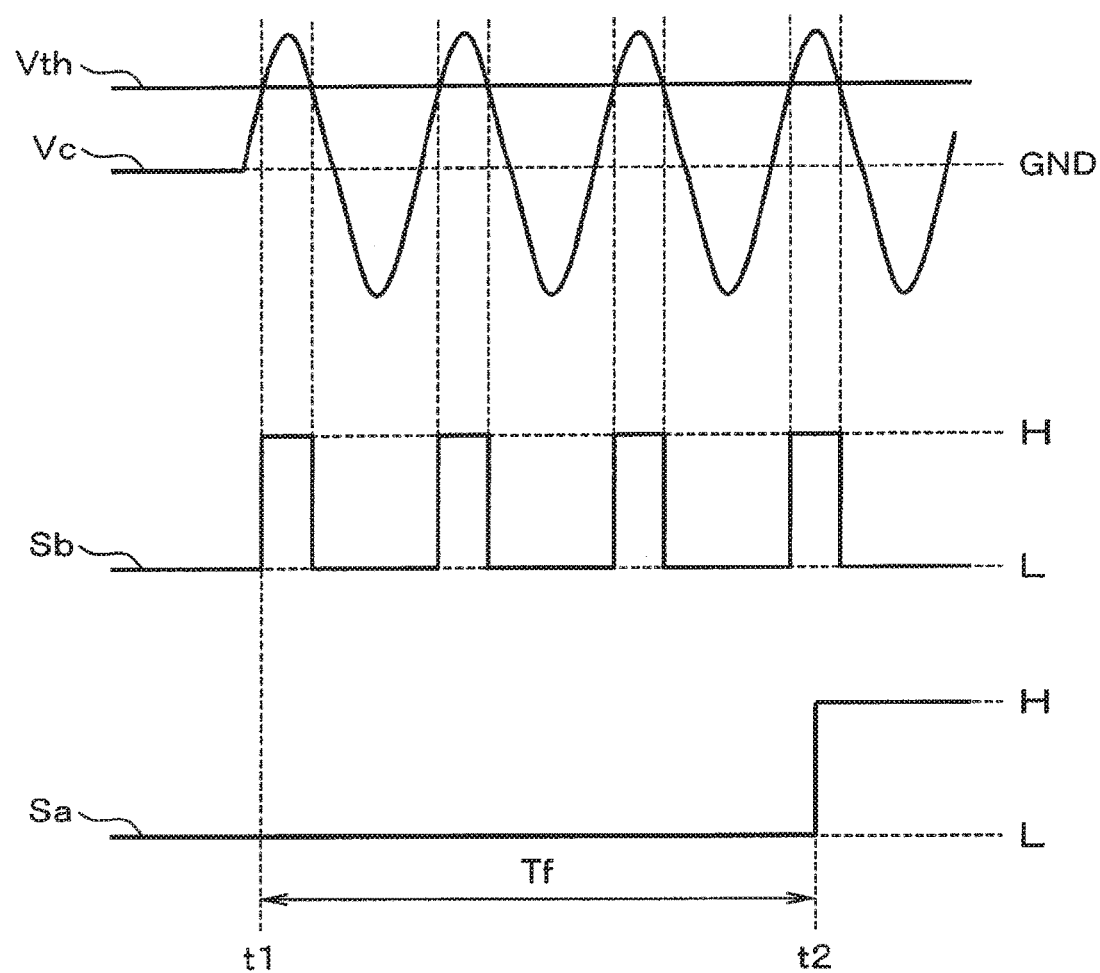
FIG. 12 is a chart showing waveforms of various parts for describing a noise detecting operation.

As shown in FIG. 12, the periodicity determination unit 42 starts measuring a predetermined periodicity determination period Tf from the time point t1 when the pulse signal Sb is first inverted. When edges of the pulse signal Sb are detected continuously during the periodicity determination period Tf, the periodicity determination unit 42 changes the noise detection signal Sa to H level at the end point t2 of the measurement period.

This configuration also provides functions and effects similar to those of the first embodiment.

The noise detector circuit 41 of this embodiment determines whether or not periodic noise is superimposed based on whether or not edges of the pulse signal Sb are detected continuously during the predetermined periodicity determination period Tf, so that the time required for the determination is constant irrespective of the cycles of the noise. According to this embodiment, the presence or absence of periodic noise can be detected within a predetermined period irrespective of noise cycles, so that, even when low-frequency noise is superimposed, it does not take unnecessarily long before the noise is detected.

(Other Embodiments)

The present disclosure is not limited to the embodiments described above and illustrated in the drawings, and the following modifications or extensions are possible.

The pulse width of the pulse signal Sb changes in accordance with the period in which voltage Vc exceeds voltage Vth in the first and third embodiments, i.e., the pulse width is varied based on temporal changes of noise. Instead, the pulse width of the pulse signal Sb may be fixed. The pulse width of the pulse signal Sb can be fixed by adopting a configuration, for example, wherein the pulse signal is turned to H level when voltage Vc reaches voltage Vth, and turned to L level after a predetermined fixed time has passed from that time point. In this way, the pulse signal Sb is generated with a constant pulse width irrespective of changes in the noise, so that the problem of missing pulses where necessary pulses are not generated will not occur.

Figure 13:
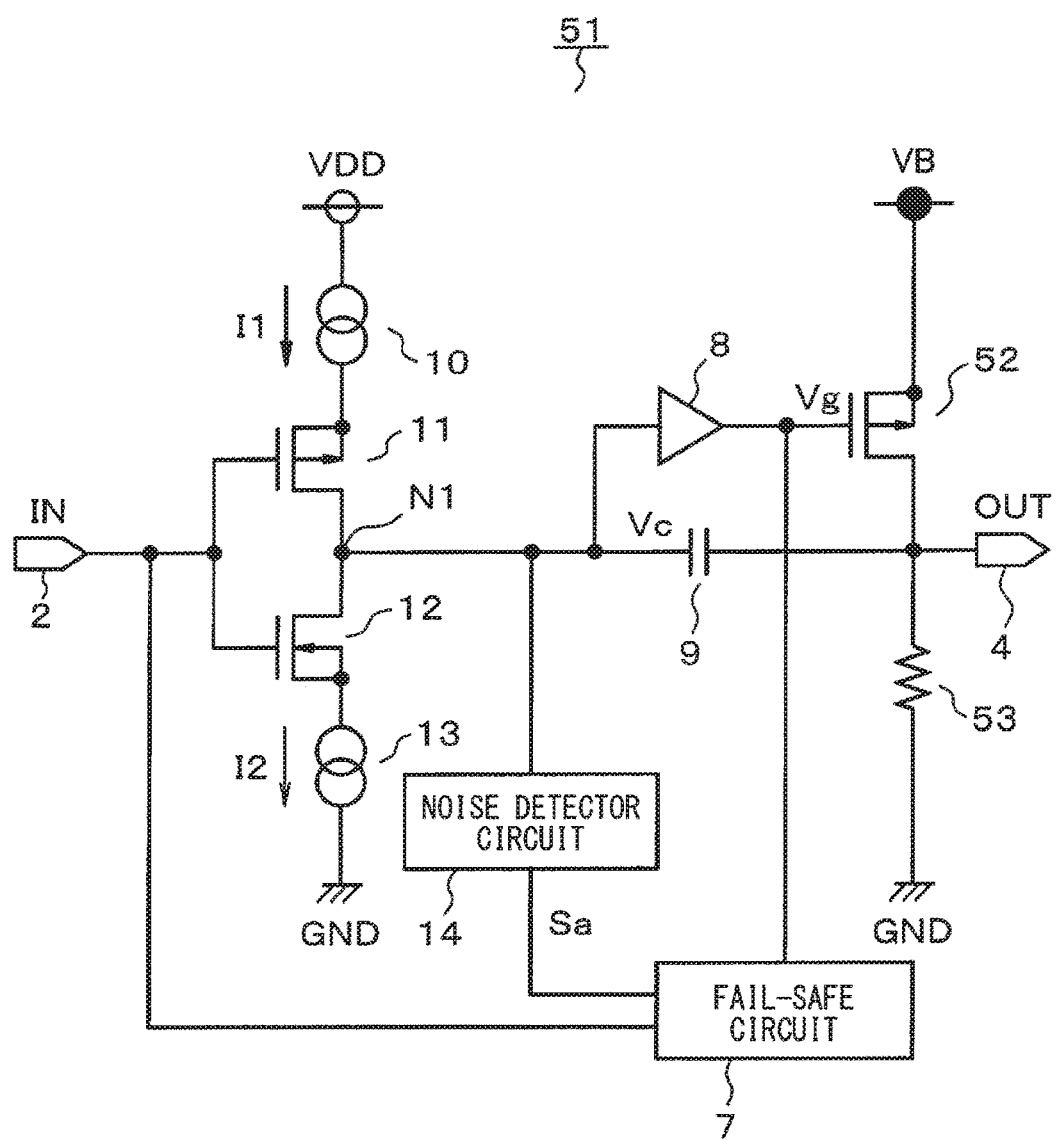
FIG. 13 is a diagram illustrating a schematic configuration of a signal output circuit with a variation in the output stage.

In various embodiments described above, the signal output circuit has a low-side driver configuration wherein an N-channel MOS transistor 3 is used as the output transistor and its drain voltage is pulled up by the resistor 5. The configuration of the output stage is not limited to this. For example, as shown in FIG. 13, a signal output circuit 51 may have a high-side driver configuration wherein a P-channel MOS transistor 52 is used as the output transistor, and its drain voltage is pulled down by the resistor 53.

The noise detector circuit need not determine whether the noise has periodicity or not if failures caused by erroneous detection of noise need not be taken into consideration or if the signal output circuit has sufficient resistance against destruction due to ESD or the like. In other words, the signal output circuit may adopt a configuration wherein the forced drive operation is performed immediately when noise superimposed on the output terminal 4 is detected.

The buffer 8 may be omitted if the effects of noise that propagates into internal circuits via a parasitic capacitance of the output transistor need not be taken into consideration.

Figure 14:
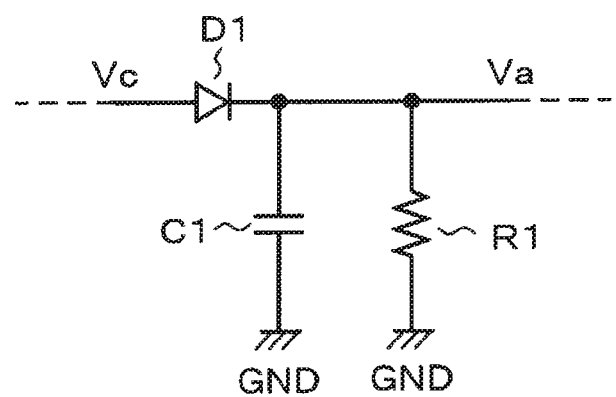
FIG. 14 is a first view illustrating another specific configuration example of the voltage converter.
Figure 15:
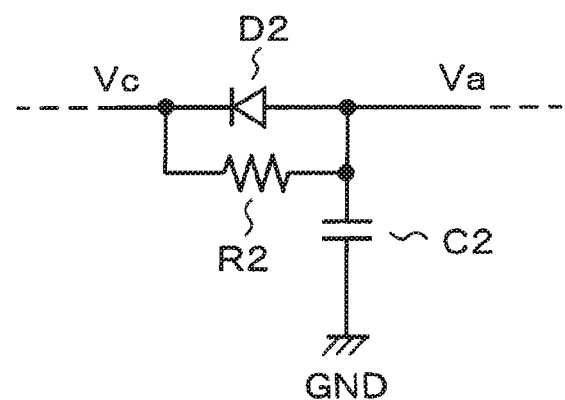
FIG. 15 is a second view illustrating another specific configuration example of the voltage converter.

FIG. 14 and FIG. 15 show examples of specific configurations for the voltage converter 32. The configuration of FIG. 14 includes a resistor R1 added to the configuration of FIG. 9. The resistor R1 is provided for releasing the charges stored in the capacitor C1 and connected in parallel to the capacitor C1. With this configuration, the operation for cancelling the forced drive operation by the periodicity determination unit 34 can be changed as follows.

In the configuration of FIG. 14, when noise disappears, charging of the capacitor C1 is stopped, so that voltage Va decreases in accordance with the RC time constant. The periodicity determination unit 34 is configured such that it changes the noise detection signal Sa to L level when voltage Va decreases as low as to a threshold such as voltage Vth. In this way, the forced drive operation can be cancelled with a simpler configuration. The time for cancelling until the forced drive operation is ended can be adjusted by the settings of the capacitance of the capacitor C1, resistance of the resistor R1, and the threshold such as voltage Vth.

The configuration of FIG. 15 includes a diode D2, a capacitor C2, and a resistor R2. The diode D2 is connected between an input node to which voltage Vc is given, and an output node that outputs voltage Va, such that the anode is on the output node side. The capacitor C2 is connected between the output node and the ground. The resistor R2 is provided for charging the capacitor C2 and connected in parallel to the diode D2.

In the normal state where no noise is superimposed, the capacitor C2 is charged via the resistor R2, so that voltage Va is close to VDD. Every time noise is superimposed, the capacitor C2 is discharged via the diode D2, so that voltage Va drops gradually. When voltage Va reaches voltage Vth after that, the noise detection signal Sa turns to H level, and the fail-safe circuit 7 performs the forced drive operation.

With this configuration, the operation for cancelling the forced drive operation by the periodicity determination unit 34 can be changed as follows. In the configuration of FIG. 15, when noise disappears, discharging of the capacitor C2 is stopped, so that voltage Va increases in accordance with the RC time constant. The periodicity determination unit 34 is configured such that it changes the noise detection signal Sa to L level when voltage Va increases as high as to a threshold such as voltage Vth. In this way, the forced drive operation can be cancelled with a simpler configuration. As with the configuration of FIG. 14, the time for cancelling can be adjusted by the settings of various circuit constants.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A signal output circuit configured to output an output signal at a level in accordance with a level of a control signal, which is input from outside, from an output terminal connected to one main terminal of an output transistor by controlling drive of the output transistor based on the control signal, the signal output circuit comprising:
   a noise detector circuit that is configured to detect noise superimposed on the output terminal;
   a feedback capacitor including a first terminal and a second terminal, the first terminal being connected to the output terminal and the second terminal being connected to the noise detector circuit;
   a slope control circuit that is configured to charge and discharge the feedback capacitor in accordance with the level of the control signal, and that is configured to control a slope of the output signal by driving the output transistor through a voltage of the second terminal of the feedback capacitor;
   and
   a fail-safe circuit that is configured to perform a forced drive operation on the output transistor to output the output signal at the level in accordance with the level of the control signal, regardless of the output transistor being driven by the slope control circuit, in response to the noise being detected by the noise detector circuit.

2. The signal output circuit according to claim 1, wherein the fail-safe circuit is configured to perform the forced drive operation in response to periodic noise being detected by the noise detector circuit.

3. The signal output circuit according to claim 2, wherein the noise detector circuit includes:
   a counter unit that is configured to count a number of cycles of noise superimposed on the output terminal, and
   a periodicity determination unit that is configured to determine that the noise has periodicity in response to the number of cycles of the noise counted by the counter unit reaching or exceeding a predetermined number.

4. The signal output circuit according to claim 2, wherein the noise detector circuit includes:
   a voltage converter that is configured to output a voltage, which changes in response to the noise being superimposed on the output terminal, and
   a periodicity determination unit that is configured to determine that the noise has periodicity in response to an output voltage of the voltage converter reaching a predetermined determination reference voltage.

5. The signal output circuit according to claim 4, wherein the voltage converter includes a capacitor, which is charged or discharged by a current generated by the noise superimposed on the output terminal, and wherein the voltage converter is configured to output a terminal voltage of the capacitor.

6. The signal output circuit according to claim 2, wherein the noise detector circuit includes a periodicity determination unit, which is configured to measure a predetermined periodicity determination period from a time point in response to the noise superimposed on the output terminal being firstly detected and to determine that the noise has periodicity in response to the noise being continuously detected during the periodicity determination period.

7. The signal output circuit according to claim 2, wherein the output signal is a signal used for communication, and wherein a period required for the noise detector circuit to determine whether the noise superimposed on the output terminal is periodic is shorter than a period of the communication.

8. The signal output circuit according to claim 1, wherein the fail-safe circuit that is configured to end the forced drive operation in response to the noise detector circuit stopping noise detection after starting the forced drive operation.

9. The signal output circuit according to claim 8, wherein the fail-safe circuit that is configured to end the forced drive operation in response to no noise having been detected by the noise detector circuit for a duration of a predetermined end determination period after starting the forced drive operation.

10. The signal output circuit according to claim 1, further comprising:

a buffer connected between the second terminal of the feedback capacitor and a current control terminal of the output transistor.

* * * * *